(12) United States Patent
Knight

(10) Patent No.: US 8,672,149 B2
(45) Date of Patent: Mar. 18, 2014

(54) THERMOCHROMIC EQUIPMENT RACK

(75) Inventor: Paul A. Knight, Spokane, WA (US)

(73) Assignee: Telect, Inc., Liberty Lake, WA (US)

( * ) Notice: Subject to any disclaimer, the term of this patent is extended or adjusted under 35 U.S.C. 154(b) by 269 days.

(21) Appl. No.: 13/022,549

(22) Filed: Feb. 7, 2011

(65) Prior Publication Data

US 2012/0199542 A1 Aug. 9, 2012

(51) Int. Cl.
*A47F 5/00* (2006.01)
(52) U.S. Cl.
USPC ............................ 211/183; 374/162
(58) Field of Classification Search
USPC ............... 211/183, 1; 361/679.6; 116/216; 374/162, E11.018; 312/223.1, 213, 287
See application file for complete search history.

(56) References Cited

U.S. PATENT DOCUMENTS

| | | | |
|---|---|---|---|
| 4,891,250 A * | 1/1990 | Weibe et al. | 374/162 |
| 5,649,766 A * | 7/1997 | Blake | 374/162 |
| 5,738,442 A * | 4/1998 | Paron et al. | 374/162 |
| 5,772,328 A * | 6/1998 | Kronberg | 374/162 |
| 5,857,776 A * | 1/1999 | Blixt et al. | 374/162 |
| 6,185,098 B1 * | 2/2001 | Benavides | 312/223.1 |
| 6,201,694 B1 * | 3/2001 | Turunen | 312/223.1 |
| 6,467,953 B1 * | 10/2002 | Faries et al. | 374/162 |
| 6,535,382 B2 * | 3/2003 | Bishop et al. | 312/223.1 |
| 6,932,443 B1 * | 8/2005 | Kaplan et al. | 312/213 |
| 7,307,245 B2 * | 12/2007 | Faries et al. | 374/E11.018 |
| D567,120 S | 4/2008 | Merchant | |
| 7,691,458 B2 * | 4/2010 | Brist et al. | 428/1.3 |
| 7,978,469 B2 * | 7/2011 | Tsakanikas | 361/690 |
| 8,077,455 B2 * | 12/2011 | Jian | 361/679.48 |
| 2001/0027741 A1 * | 10/2001 | Qiu et al. | 374/162 |
| 2005/0168945 A1 * | 8/2005 | Coglitore | 361/695 |
| 2006/0182165 A1 * | 8/2006 | Tapelt-Glaser | 374/162 |
| 2006/0203882 A1 * | 9/2006 | Makela et al. | 374/161 |
| 2006/0291533 A1 * | 12/2006 | Faries et al. | 374/162 |
| 2008/0121171 A1 | 5/2008 | Hulsey | |
| 2008/0142529 A1 * | 6/2008 | LaGuardia et al. | 374/162 |
| 2008/0259996 A1 * | 10/2008 | Lee et al. | 374/162 |
| 2010/0020846 A1 * | 1/2010 | Kagan et al. | 374/141 |
| 2010/0027205 A1 | 2/2010 | Cao | |

OTHER PUBLICATIONS

"Upsite Temperature Strip", Upsite Technologies Inc, Specification Sheet, 2010, 1 page, retrieved on Nov. 19, 2010 at <<http://upsitetechnologies.com/index.php?option=com_content&task=view&id=3&Itemid=5>>.

* cited by examiner

*Primary Examiner* — Jose V Chen
(74) *Attorney, Agent, or Firm* — Lee & Hayes, PLLC

(57) ABSTRACT

A thermochromic indicator is vertically disposed on a rack. Such that the thermochromic indicator is visible from a distance. In some examples, the thermochromic indicator indicates a bulk air temperature and a gradient air temperature. The thermochromic indicator provides a real-time visual of air temperatures of computing equipment and devices housed within a computing facility. The thermochromic indicator may be vertically disposed on a front-face and/or a back-face or a rack. A plurality of thermochromic indicators may be disposed on a plurality of front-faces and/or back-faces of racks of an array of racks.

23 Claims, 5 Drawing Sheets

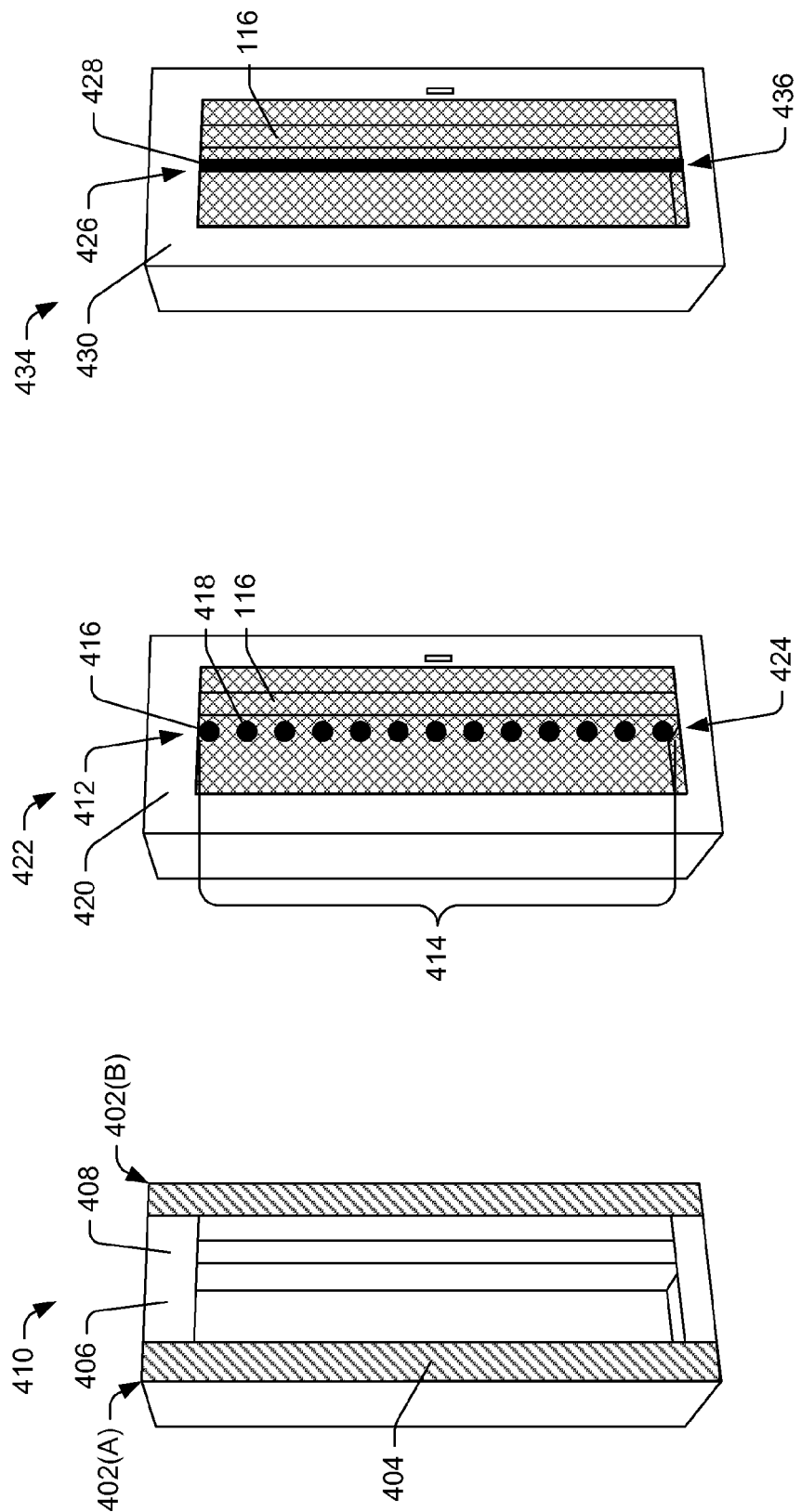

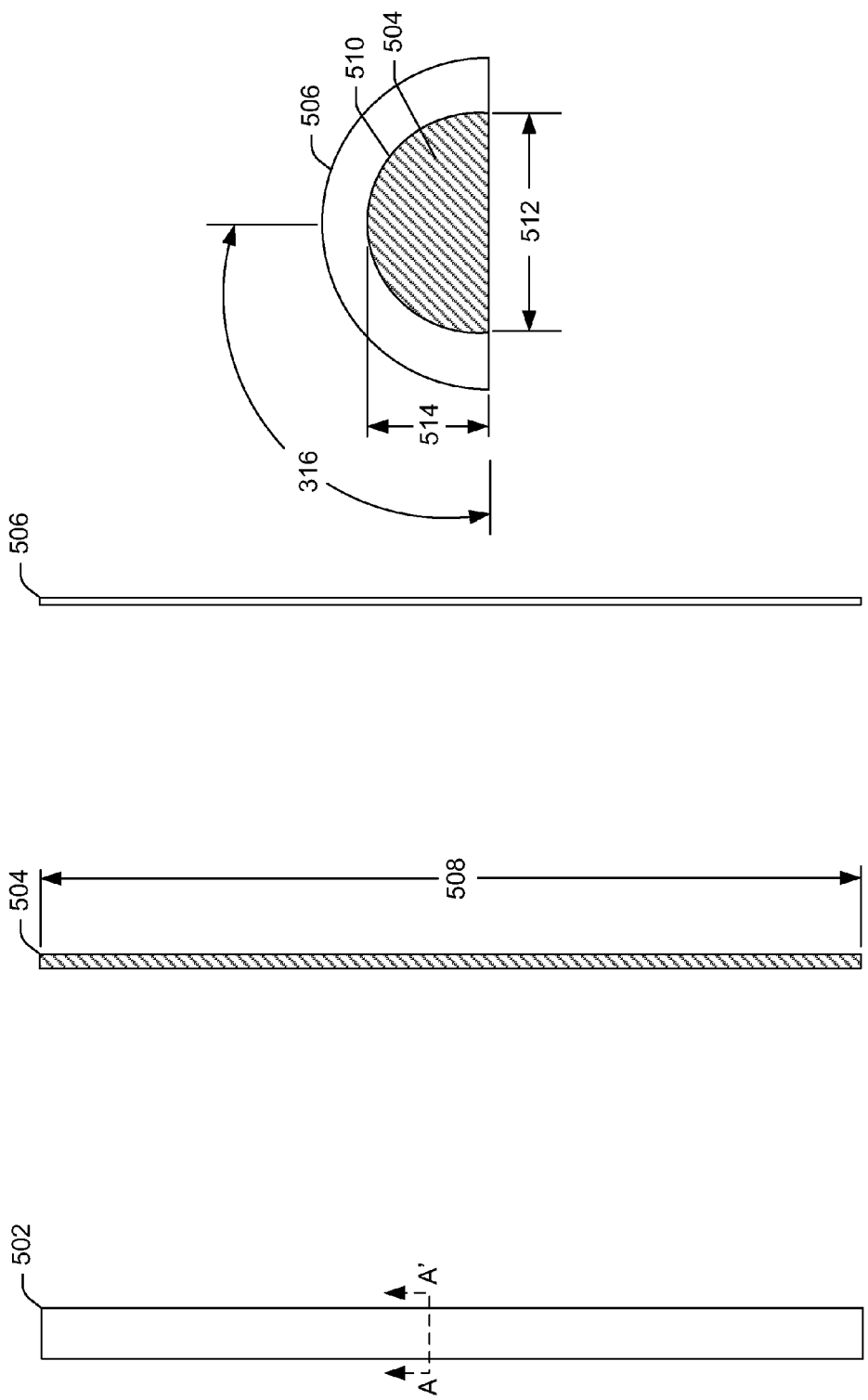

THERMOCHROMIC EQUIPMENT RACK

BACKGROUND

Thermal management of computing equipment and devices is critical to their performance and reliability. The thermal management equipment used to keep these computing equipment and devices at a precise temperature consume large amounts of power.

Thermal management devices and methods exist for managing the temperature of a computing facility to provide an abundance of air at the right temperature for the computing equipment and devices house within. There are many recommendations for optimal air temperatures of computing facilities. The American Society of Heating, Refrigeration and Air-Conditioning (ASHRAE) provides recommended ranges of humidity and air temperature of computing facilities to help save energy while keeping the computing equipment and devices performing optimally. For example, ASHRAE recommends a low end inlet air temperature of 18 degrees Celsius and a high end inlet air temperature of 27 degrees Celsius.

Many thermal management devices exist that provide for users (e.g., information technology (IT) personnel, facilities personnel, operational personnel, or the like) to keep the air temperature of computing facilities within the recommended ranges. For example, digital sensors, infrared cameras, infrared thermometers, and temperature strips can all be used to measure air temperatures associated with racks and objects contained within computing facilities. However, these thermal management devices are often too expensive and/or do not provide all the needed information.

SUMMARY

A thermal indicating system is provided to produce a real-time visual of air temperatures of computing equipment and devices house within a computing facility. In one example, a thermochromic indicator is disposed vertically on a front-face of a rack. In another example, a thermochromic indicator is disposed vertically on a front-face of a rack along with another thermochromic indicator disposed vertically on a back-face of the rack.

In another example, a thermochromic indicator is disposed vertically along the front-face of each of a plurality of racks that are arranged in an array. In another example, a thermochromic indicator is disposed vertically along the front-face of each of a plurality of racks that are arranged in an array along with another thermochromic indicator disposed vertically on a back-face of each of the plurality of racks that are arranged in another array.

In yet another example, a thermochromic indicator is configured to be vertically disposed on a rack. Here, a thermochromic material is disposed on a curvilinear surface arranged along a vertical height of a substrate material. The substrate material being configured to be removeably attached vertically to the rack.

BRIEF DESCRIPTION OF THE DRAWINGS

The detailed description is described with reference to the accompanying figures. The use of the same reference numbers in different figures indicates similar or identical items.

FIG. 4A, FIG. 4B, and FIG. 4C, illustrate four exemplary implementations of thermochromic indicators capable of being seen from a distance.

FIG. 5A illustrates a front view of a thermochromic indicator.

FIG. 5B illustrates a side view of a base material of the thermochromic indicator of FIG. 5A.

FIG. 5C illustrates a side view of a thermochromic material of the thermochromic indicator of FIG. 5A.

FIG. 5D is an enlarged cross-sectional view of the thermochromic indicator of FIG. 5A.

DETAILED DESCRIPTION

Overview

Figure 1:
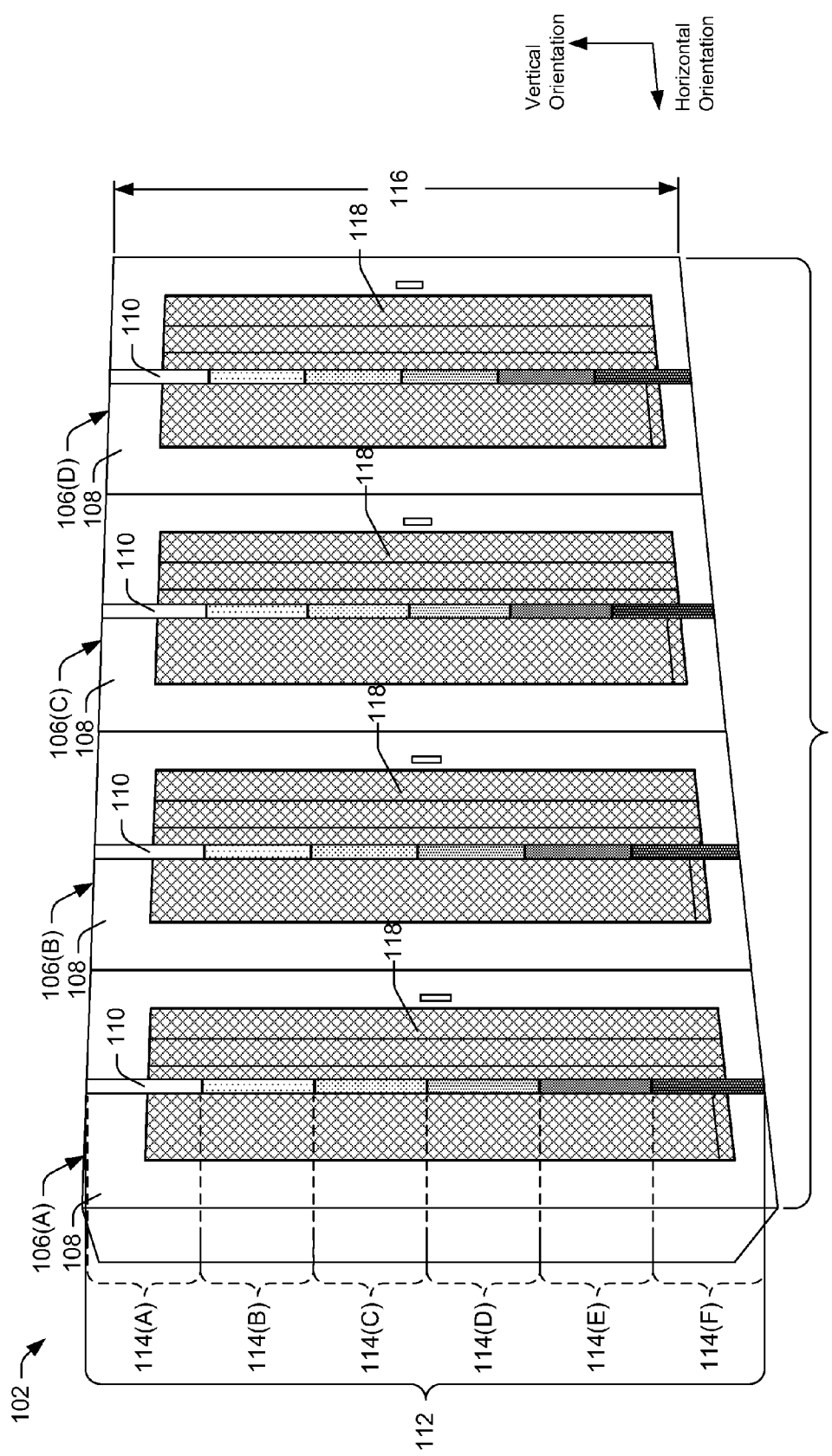
FIG. 1 illustrates an exemplary array of thermochromic indicators disposed vertically along a front-face of each of a plurality of racks, defining a cold air inlet side of the array, housed within a computing facility.

As discussed above, existing thermal management devices fail to adequately provide information to operators. For example, existing devices fail to provide thermal management devices that are inexpensive and that provide operational personnel with a real-time visual thermal gradient of computing facilities.

This disclosure is directed to thermal indicating systems having thermochromic indicators disposed vertically along front-faces and back-faces of racks, thereby visually indicating an overall air temperature map of the computing facility at the same moment in time. In some implementations, the thermochromic indicators comprise a thermochromic material disposed on a substrate material, the substrate material having a curvilinear surface.

Traditionally, temperature indicating devices have been designed to indicate a temperature of air entering racks (e.g., the "Upsite Temperature Strip" made available from Upsite Technologies® located in Albuquerque, N. Mex., USA). Because these traditional temperature indicating devices indicate a temperature of air entering a local point of a rack, it does not give an overall air temperature map at the same moment in time. As such, a user must record individual air temperatures and subsequently map them to understand how rack air temperatures vary in space (e.g., down an aisle). Recording point temperatures is also not effective because temperatures of computing equipment and devices housed within a computing facility can change quickly due to changing performances. In addition to designing temperature indicating devices to indicate a temperature of air entering racks, temperature indicating devices also exist to indicate temperatures of all the surfaces of computing facility objects, including the surfaces of the racks. Such temperature indicating devices include infrared cameras and thermometers, for example. Because these traditional temperature indicating devices indicate temperatures of all the surfaces of computing facility objects the results are skewed by varying emissivity of the all the objects in view. Further, these traditional temperature indicating devices usually require the purchase of expensive infrared camera equipment and therefore cost more to operate. Accordingly, this disclosure describes thermal indicating systems that are substantially easier to use and less expensive, and therefore provide operational personnel the improved ability to manage a computing facility's HVAC energy costs while simultaneously keeping the computing equipment and devices performing optimally.

To achieve the ease of use and reduced costs, in one example this application describes a thermochromic indicator that is disposed vertically on a front-face of a rack. The thermochromic indicator indicates an air temperature of air entering along the vertical height of the front-face of the rack.

The thermochromic indicator may be of any thermochromic implementation capable of being seen from a distance. For example, the thermochromic indicator may be a strip of thermochromic ink, an array of individual thermochromic marks, thermochromic paint applied to the rack, thermochromic plastic fastened to the rack, thermochromic labels fastened to the rack, or the like, capable of being seen from a distance. Because the thermochromic indicator is visible from a distance it provides a visual of air temperatures along the vertical length of the rack. By providing a real-time visual of air temperatures along the vertical length of the rack, the thermochromic indicator in turn provides operational personnel with the ability to see hot spots, airflow mixing, and inadequate airflow. Further, a video or sequence of photos of the thermochromic indicator over a period of time may be captured or recorded. These images may then be provided to a computer, which could create a computerized temperature map, which could then be used to control the HVAC system. The computer could also calculate bulk air temperatures using these images.

In another example, a thermochromic indicator is disposed vertically on a front-face of a rack along with another thermochromic indicator disposed vertically on a back-face of the rack. The front-face thermochromic indicator indicates an air temperature of air entering along the vertical height of the front-face of the rack. The back-face thermochromic indicator indicates an air temperature of air exiting along the vertical height of the back-face of the rack. By providing a real-time visual of air temperatures along the vertical length of a front-face of a rack and a real-time visual of air temperatures along the vertical length of a back-face of the same rack, the thermochromic indicators in turn provide operational personnel with the ability to see air temperature differences across (i.e., front to back) computing equipment and devices housed within the rack. The resulting real-time visual of air temperatures (i.e., a temperature map) also intuitively provides a map of airflows. The map of airflows provides a real-time visual of changes in temperature as related to performances of the computing equipment and devices housed within the rack. For example, consider a rack that house a group of blade servers. At one moment in time, the blade servers may be in a standby mode where the temperatures of the blade servers are at one state (e.g., a low power consumption state), while, moments later, the blade servers may transition to another state (e.g., a high power consumption state). While the blade servers are in the high power consumption state, the blade servers may ramp-up to tens of thousands of watts of power consumption, thus increasing airflows and temperatures. By providing a real-time visual of air temperatures, the thermochromic indicators provide operational personnel with a visual indicator and intuition on how the components of a computing facility operate over time.

In another example, a thermochromic indicator is disposed vertically along the front-face of each of a plurality of racks that are arranged in an array. The thermochromic indicators indicate an air temperature of cold air entering vertically along the front-face of the respective rack. By providing a real-time visual of air temperatures along the vertical length of each front-face of each of the plurality of racks in the array, the thermochromic indicators in turn provide operational personnel with the ability to see an airflow and an air temperature of the entire array of racks. Moreover, this configuration allows operational personnel to see temperatures of each rack relative to other racks in the array.

In another example, a thermochromic indicator is disposed vertically along the front-face of each of a plurality of racks that are arranged in an array along with another thermochromic indicator disposed vertically on a back-face of each of the plurality of racks that are arranged in another array. The front-face thermochromic indicators indicate an air temperature of cold air entering vertically along the front-face of the respective rack. The back-face thermochromic indicators indicate an air temperature of hot air exiting vertically along the back-face of the respective rack. By providing a real-time visual of air temperatures along the vertical length of each front-face of each of the plurality of racks and each back-face of each of the plurality of racks, the thermochromic indicators not only provide operational personnel with the ability to see airflow and air temperature of the entire array of racks, but also the ability to see air temperature differences across computing equipment and devices housed within each rack of the array.

In another example, an array of thermochromic indicators disposed vertically along front-faces of each of a plurality of racks that are arranged in an array are flanked by another array of thermochromic indicators disposed vertically along front-faces of each of a plurality of racks that are arranged in another array. Again the front-face thermochromic indicators indicate an air temperature of cold air entering vertically along the front-face of the respective rack. By providing a real-time visual of air temperatures along the vertical length of each front-face of each of the plurality of racks flanked by another array of thermochromic indicators disposed vertically along front-faces of each of a plurality of racks that are arranged in another array, the thermochromic indicators not only provide operational personnel with the ability to see airflow and air temperature of the entire array of racks, but also the ability to see air temperature differences across individual aisles of the computing facility.

In yet another example, a thermochromic indicator is configured to be vertically disposed on a rack. Here, a thermochromic material is disposed on a curvilinear surface arranged along a vertical height of a substrate material. The substrate material may be configured to be removeably attached vertically to the rack. In addition the substrate material may comprise a horizontal width and a material thickness that allow it to be viewed from a distance, yet narrow enough to minimize impedance of airflow of a rack. Further, the curvilinear surface may be configured to protrude distally from either the front-face or the back-face of a rack and are viewable from different angles. The material thickness being configured to allow the thermochromic material disposed on the substrate material to measure the air temperature while providing appropriate resolution and response time. For example, the substrate material may be configured to comprise a volumetric heat capacity that allows the substrate material to be effected by the air temperature at a preferred rate.

Because these thermochromic indicators provide operational personnel with the ability to see hot spots and airflow mixing at the rack level, rack array level, and aisle level of a computing facility, it is easier to manage a computing facility's airflow and air temperature. By being able to manage a computing facility's airflow and air temperature this in turn provides the ability to reduce energy consumption by a computing facility's HVAC system.

While the illustrated embodiments show a thermochromic indicator as a strip that may be disposed substantially proximate to a middle portion of a rack, other locations are contemplated. For example, the thermochromic indicator may be configured to be disposed on the entire surface portion of the front-face and/or back-face of the rack (e.g., painted on). Further, the thermochromic indicator may be configured to be disposed on any number of corners of the rack. Still further, the thermochromic indicator may be configured as an assembly to be removeably disposed to any portion of the rack (e.g., the thermochromic indicator may be removably disposed to a front-face, back-face, door, perforated door, panel, wall, or the like).

The term "computing facility" is used to describe a server room, a central office, a remote site, or any other facility comprising electronics and a cooling system (e.g., HVAC system).

The term "operational personnel" is used to describe personnel tasked with a computing facilities operation and maintenance.

Example Thermal Indicating System

Figure 2:
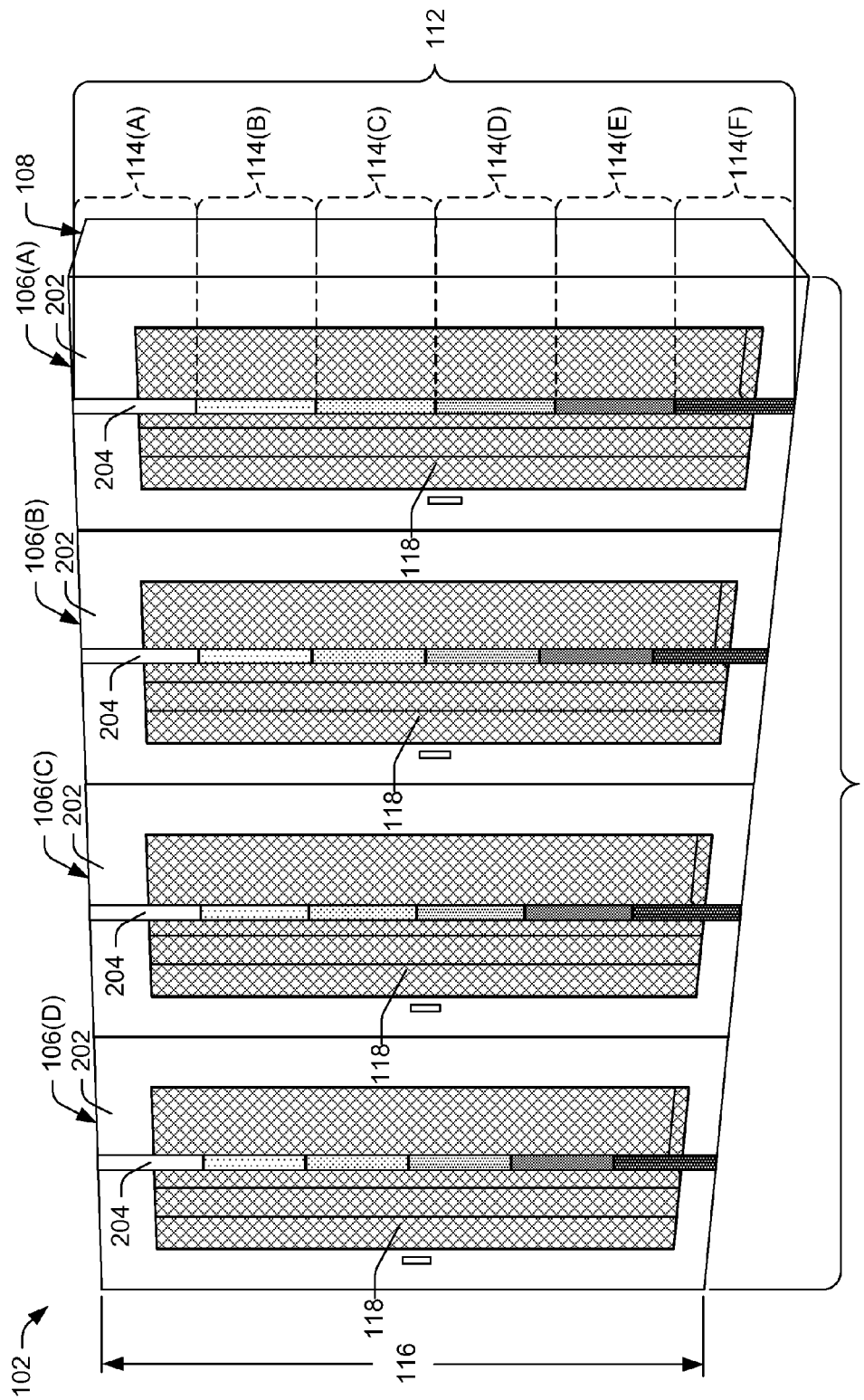
FIG. 2 illustrates an exemplary array of thermochromic indicators disposed vertically along a back-face of each of a plurality of racks, defining a hot air exit side of the array, housed within a computing facility.

FIG. 2 illustrates a thermal indicating system 102. The thermal indicating system 102 comprises an array 104 of rack(s) 106(A), 106(B), 106(C), and 106(D). Each of the rack(s) 106(A)-106(D) is illustrated as having a front-face 108, which defines a cold air inlet side of the array 104. While FIG. 1 illustrates an array 104 comprising four racks, any number of racks could be used. FIG. 1 illustrates thermochromic indicators 110 disposed vertically along the front-faces 108 of the plurality of rack(s) 106(A)-106(D). Each of the thermochromic indicators 110 may indicate a bulk air temperature 112 and a gradient air temperature 114(A), 114(B), 114(C), 114(D), 114(E), and 114(F). The term "bulk air temperature" is used to describe an overall (e.g., macro) air temperature. The term "gradient air temperature" is used to describe a series of individual (e.g., micro) temperatures. Operational personnel may determine the bulk air temperature by averaging the sum of the gradient air temperatures.

While FIG. 1 illustrates a gradient air temperature comprising six individual sections of temperatures, the gradient air temperature may comprise any number of individual sections of temperatures. For example, the thermochromic indicator 110 may be configured to comprise a continuous bandwidth of temperatures (e.g., infinite individual sections of temperatures). Further, while FIG. 1 may illustrate each thermochromic gradient air temperature 114(A)-114(F) as comprising individual fill patterns, this is for illustrative purposes only. For example, by definition, the thermochromic indicator 110 comprises a color change and therefore each thermochromic gradient air temperature 114(A)-114(F) fill pattern may represent a different color. The color change may be one, two, three, four, or any other number of color changes. That is, a single region may represent one, two, three, four, or any number of different temperature ranges. Further, while FIG. 1 illustrates each thermochromic indicator 110 having the same gradient air temperature 114(A)-114(F), each thermochromic indicator 110 may comprise different gradient air temperatures.

In one embodiment, with respect to the cold air inlet side of the array 104, illustrated in FIG. 1, the thermochromic indicators 110 may be configured to visually present one, two, three, or four color changes while interfacing with cold air ranging from approximately 15 degrees Celsius to approximately 30 degrees Celsius. In addition, while being configured to visually present one, two, three, or four color changes, while interfacing with cold air ranging from approximately 15 degrees Celsius to approximately 30 degrees Celsius, the thermochromic indicators 110 may be configured to visually provide a 2 to 5 degrees Celsius incremental difference. Further, the thermochromic indicators 110 may be configured to visually present one, two, three, or four color changes while interfacing with cold and/or hot air ranging from approximately 15 degrees Celsius to approximately 50 degrees Celsius, while being configured to visually provide a 2 to 5 degrees Celsius incremental difference.

FIG. 1 illustrates the plurality of rack(s) 106(A)-106(D) having a vertical height 116. Vertical height 116 may be any standard rack height. For example, vertical height 116 may be 22 rack units (RUs) to 40 RUs or more in height. In some examples, the racks may have solid doors, vented/louvered doors, etc., or may omit doors entirely. FIG. 1 also illustrates a perforated door 118 disposed on the front-faces 108 of each rack 106(A)-106(D). FIG. 1 illustrates that the thermochromic indicators 110 may be disposed substantially along the entire vertical height 116 of the front-faces 108 of each rack 106(A)-106(D). However, in other embodiments, the thermochromic indicators 110 may extend less than the full height 116 of the racks. For example, the thermochromic indicators may extend substantially the length of the door 118. In other examples, the thermochromic indicators may extend even less of the height of the racks.

With the thermochromic indicators 110 providing a real-time visual of air temperatures along substantially the entire vertical height 116 of the rack(s) 106(A)-106(D), each of the thermochromic indicators 110 in turn provides operational personnel with the ability to see hot spots, airflow mixing, and inadequate airflow associated with each of the rack(s) 106(A)-106(D).

With the thermal indicating system 102 providing operational personnel with the ability to see hot spots, airflow mixing, and inadequate airflow associated with each of the rack(s) 106(A)-106(D), operational personnel may identify potential problems before they occur. For example, a hot spot in one of the rack(s) 106(A)-106(D), may indicate an airflow issue which may be corrected using blanking plates in the rack. Further, a single rack, of the plurality of rack(s) 106(A)-106(D), that is warmer than the rest, could indicate an airflow issue which may be corrected using blanking plates in the hot rack. Alternatively, a single rack that is warmer than the rest of the plurality of rack(s) 106(A)-106(D), could be a result of the type of equipment (e.g., side-to-side cooled router versus front-to-back airflow server) housed in the rack.

FIG. 2 illustrates the thermal indicating system 102 of FIG. 1, where each of the plurality of rack(s) 106(A)-106(D) further comprise a back-face 202 opposite the front-face 108. The back-faces 202 define a hot air exit side of the array 104. FIG. 2 illustrates another thermochromic indicator 204 disposed vertically along each of the back-faces 202 of the plurality of rack(s) 106(A)-106(D). While FIG. 2 illustrates another thermochromic indicator 204 that is substantially the same as the thermochromic indicator 110 discussed above with respect to FIG. 1, the other thermochromic indicator 204 may be alternatively configured to visually present color changes while interfacing with hot air exiting the rack(s) 106(A)-106(D). For example, in one embodiment with respect to the hot air exit side of the array 104, the thermochromic indicators 204 may be configured to visually present one, two, three, or four color changes while interfacing with hot air ranging from approximately 25 degrees Celsius to approximately 50 degrees Celsius. In addition, while being configured to visually present one, two, three, or four color changes, while interfacing with hot air ranging from approximately 25 degrees Celsius to approximately 50 degrees Celsius, the thermochromic indicators 204 may be configured to visually provide a 2 to 5 degrees Celsius incremental difference. As discussed above, each of the thermochromic indicators 110 may indicate a bulk air temperature 112 and a gradient air temperature 114(A)-114(F).

FIG. 2 also illustrates the plurality of rack(s) 106(A)-106 (D) having the vertical height 116, which as discussed above, may be any standard or custom rack height. Similarly, FIG. 2 also illustrates a perforated door 118 disposed on the back-faces 202 of each of the rack(s) 106(A)-106(D). FIG. 2 illustrates the thermochromic indicators 204 may be disposed substantially along the entire vertical height 116 of the back-faces 202 of each of the rack(s) 106(A)-106(D). However, as discussed above, the racks may have other doors and/or the thermochromic strip may extend less than the full height.

With the thermochromic indicators 204 providing a real-time visual of air temperatures along substantially the entire vertical height 116 of the front-faces 108 of each of the rack(s) 106(A)-106(D), along with a real-time visual of air temperatures along substantially the entire vertical height 116 of the back-faces 202 of each respective rack 106, the thermochromic indicators 110 and 204 provide the operational personnel with the ability to see air temperature differences across computing equipment and devices housed within each of the rack(s) 106(A)-106(D).

Figure 3:
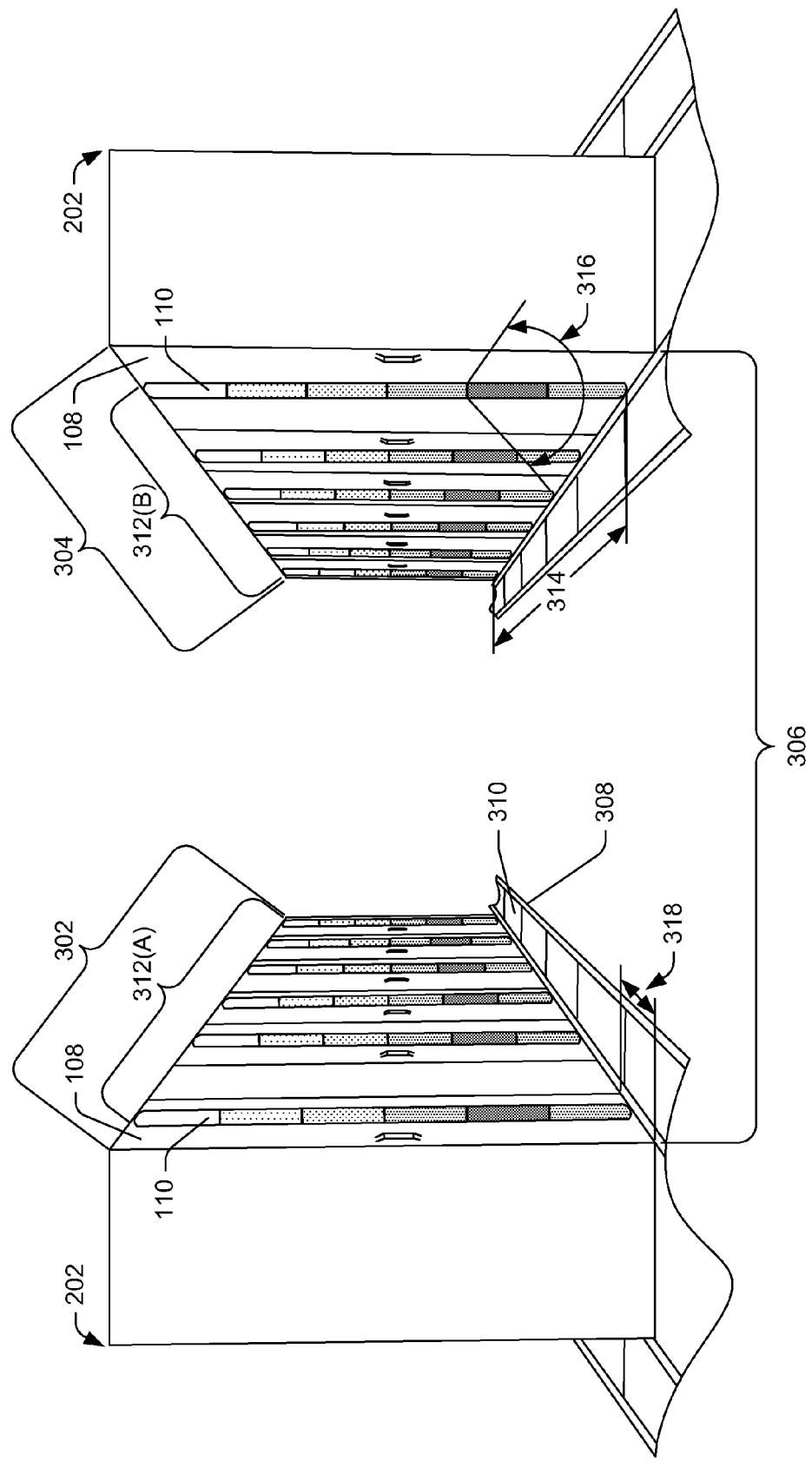
FIG. 3 illustrates an exemplary array of thermochromic indicators disposed vertically along a front-face of each of a plurality of racks, flanked by another exemplary array of thermochromic indicators disposed vertically along a front-face of each of another plurality of racks, defining a cold air aisle, housed within a computing facility.

FIG. 3 illustrates a first array 302 of a plurality of racks (e.g., rack(s) 106(A)-106(D)) flanked by a second array 304 of a plurality of racks. As discussed above, each of the plurality of racks have a front-face 108 defining a cold air inlet side of each array 302 and 304. A cold air aisle 306 may be defined by the first array 302 of the plurality of racks flanked by the second array 304 of the plurality of racks, where the cold air inlet sides of each array 302 and 304 face each other. The cold air aisle 306 may include a raised floor 308 having cold air supply vents 310. Each of the air supply vents 310 may be arranged with each rack of the plurality of racks, respectively. While FIG. 3 illustrates a cold air aisle 306, a hot air aisle is also contemplated. For example, the back-faces 202, which define the hot air exit side of each array 302 and 304, may be faced toward each other, defining a hot air aisle side. The hot air aisle side may comprise exhaust vents in the floor and/or ceiling.

FIG. 3 further illustrates an array of thermochromic indicators 312(A) disposed vertically along front-faces 108 of each of a plurality of racks flanked by another exemplary array of thermochromic indicators 312(B) disposed vertically along front-faces 108 of each of a plurality of racks. The illustrated cold air aisle 306 may be housed within a computing facility (e.g., server room, data center, central office, or the like), where a heating, ventilating, and air conditioning (HVAC) system may be integrated with the computing facility. For example, an HVAC system may vent cold air into, and hot air out of, the computing facility. Existing computing facilities may be arranged to have computing equipment and devices housed in racks or cabinets. FIG. 3 illustrates the racks are arranged in the room in order to maximize an efficiency of the HVAC system. For example, as discussed above, the racks may be arranged in arrays (e.g., rows) 302 and 304 within a room of the computing facility.

With the array of thermochromic indicators 312(A) and 312(B) disposed vertically along the front-faces 108 of each of the plurality of racks within the cold aisle 306, FIG. 3 illustrates that each thermochromic indicator of each of the arrays of thermochromic indicators 312(A) and 312(B) is visible from a distance 314, and simultaneously visible within an angle of view 316. While FIG. 3 illustrates the distance 314 being six racks deep, the distance 314 may comprise any number of racks. Further, while FIG. 3 illustrates six standard server racks (i.e., server cabinets) directly adjacent to one another in each array 302 and 304, each of the server racks may, in some embodiments, be separated a distance from each other. In addition, each of the racks may comprise a width 318, wherein the width 318 may comprise any standard width (e.g., 19 inches, 23 inches, 24 inches in width) or custom width. Furthermore, alternatively the distance 314 may be measured in inches. For example, the distance 314 may be 360 inches (914 Centimeters), 240 inches (610 Centimeters), 120 inches (305 Centimeters), or the like. Further, while FIG. 3 illustrates an angle of view 316 comprising about 70 degrees, the angle of view 316 may be up to at least 180 degrees, as long as the thermochromic indicators are simultaneously visible from one or more vantage points.

As discussed above, by disposing each of the thermochromic indicators along substantially the entire vertical length of each the racks and arranging each array of thermochromic indicators 312(A) and 312(B) such that each thermochromic indicator 110 is visible from the distance 314, the thermochromic indicators 110 not only provide operational personnel with the ability to visualize real-time airflow and air temperature of each entire array of racks 302 and 304, but also the ability to see air temperature differences across individual aisles of the computing facility. For example, the array of thermochromic indicators 312(A) and 312(B) provide operational personnel with the ability to visualize real-time airflow and air temperature differences across the array of racks 302 and 304 (i.e., temperatures of array 302 relative to temperatures of array 304). Further, because the thermochromic indicators 110 provide operational personnel with the ability to see airflow and air temperature of each array of racks 302 and 304, as well as the ability to see air temperature differences across the cold aisle 306 of the computing facility, the operational personnel may identify rack issues. For example, by seeing that a front-face 108, along with its respective back-face 202, are cool, it could be an indication that the rack has too much airflow. In this case the operational personnel may choose to correct the issue by reducing the openness of the cold air supply vent 310 of the raised floor 308 associated with the rack. In another example, observing that a front-face 108 of a rack of the array of racks 302 or 304 is cool, and the respective back-face 202 is hot (i.e., there is an above normal difference between front and back of the rack), could be an indication that the rack has too little airflow. In this case the operational personnel may choose to correct the issue by increasing airflow, e.g., by increasing the openness of the cold air supply vent 310 of the raised floor 308 associated with the rack in the example of FIG. 3. Further, observing that a front-face 108 of a rack of the array of racks 302 or 304 is uniformly cool, and the respective back-face 202 is uniformly an expected amount warmer than the front-face 108, could be an indication that the rack has ideal airflow. In another example, observing that multiple consecutive racks of the array of racks 302 and 304 are at elevated temperatures relative to other racks in the same or different arrays, could be an indication that not enough airflow is getting to these racks. In this case, the operational personnel may choose to correct the issue by increasing the cold air supply associated with the racks, or by putting blanking plates across racks.

Embodiments of Thermochromic Indicators

FIG. 4A, FIG. 4B, and FIG. 4C, illustrate three exemplary implementations of thermochromic indicators (e.g., thermochromic indicators 110) capable of being seen from a distance 314. FIG. 4A illustrates an exemplary implementation of a thermochromic indicator 402(A) and 402(B) capable of being seen from the distance 314. In this implementation, the thermochromic indicator 402(A) and 402(B) comprises a thermochromic paint 404 applied to a base metal 406 of a front-face 408 of a rack 410. While FIG. 4A illustrates the thermochromic paint 404 applied to a base metal 406 of the front-face 408, the thermochromic paint 404 may be applied to a base metal 406 of any portion of the rack 410 or to the entire rack 410. For example the thermochromic paint 404 may be applied to the base metal 406 of a back-face, a rack corner, a rack post, and any other vertical portion of the rack 410.

FIG. 4B illustrates an exemplary implementation of a thermochromic indicator 412 capable of being seen from the distance 314. In this implementation, the thermochromic indicator 412 comprises a series 414 of individual marks 416 of thermochromic ink 418 applied substantially along an entire vertical height (e.g., vertical height 116) of a front-face 420 of a rack 422 subsequent to a painting of the front-face 420. While FIG. 4B illustrates the thermochromic marks 416 of thermochromic ink 418 applied to a middle portion 424 of the front-face 408, the thermochromic marks 416 of thermochromic ink 418 may be applied to a portion adjacent to the middle portion 424, or to any other portion of the rack 410. For example, the thermochromic marks 416 of thermochromic ink 418 may be applied to the far left side and/or far right side of the middle portion 424 of the front-face 408. Further, while FIG. 4B illustrates the thermochromic marks 416 of thermochromic ink 418 applied to a middle portion 424 of the front-face 408, the thermochromic marks 416 of thermochromic ink 418 may be applied to a middle portion of a back-face (e.g., back-face 202), or any other vertical portion of the rack 422. Further, while FIG. 4B illustrates the thermochromic marks 416 of thermochromic ink 418, the thermochromic marks 416 may be formed of thermochromic paint, thermochromic labels, thermochromic plastic pieces, or the like. Further, the thermochromic marks 416 may be disposed vertically on a perforated door 118.

FIG. 4C illustrates an exemplary implementation of a thermochromic indicator 426 capable of being seen from the distance 314. In this implementation, the thermochromic indicator 426 comprises a thermochromic strip 428 applied substantially along an entire vertical height (e.g., vertical height 116) of a front-face 430 of a rack 432. The thermochromic strip 428 may comprise a strip of thermochromic ink, a strip of thermochromic paint, a strip of thermochromic label, a strip of thermochromic plastic, or the like. While FIG. 4C illustrates the thermochromic strip 428 applied to a middle portion 434 of the front-face 430, the thermochromic strip 428 may be applied to a portion adjacent to the middle portion 434, or to any other portion of the rack 432. For example, the thermochromic strip 428 may be applied to the far left side and/or far right side of the middle portion 434 of the front-face 430. Further, while FIG. 4C illustrates the thermochromic strip 428 may be applied to a middle portion 434 of the front-face 430, the thermochromic strip 428 may be applied to a middle portion of a back-face (e.g., back-face 202), or any other vertical portion of the rack 432. Further, the thermochromic strip 428 may be disposed vertically on a perforated door 118. Also, as discussed above, in other embodiments, the thermochromic indicators may extend less than the entire vertical height of the rack.

Example Thermochromic Indicator

FIG. 5A illustrates a front view of an example thermochromic indicator 502 configured to be vertically disposed on a front-face (e.g., front-face 108), a back-face (e.g., back-face 202), or a perforated door (e.g., perforated door 118) of a rack (e.g., rack(s) 106(A)-106(D)). The thermochromic indicator 502 may indicate a bulk air temperature (e.g., bulk air temperature 112) and a gradient air temperature (e.g., gradient air temperature 114(A)-114(F)). The thermochromic indicator 502 may be configured to be capable of being seen from the distance 314 and provide a real-time visual of airflow and air temperatures of computing equipment and devices housed within a computing facility.

FIG. 5B illustrates a side view of a substrate material 504 of the thermochromic indicator 502 of FIG. 5A, and FIG. 5C illustrates a side view of a thermochromic material 506 of the thermochromic indicator 502 of FIG. 5A. FIG. 5D illustrates an enlarged section view of the thermochromic indicator 502 taken along A-A' of the thermochromic indicator 502 of FIG. 5A. The substrate material 504 may be configured to be removeably attached to a rack and may comprise a vertical height 508. The vertical height 508 may have a height less than or equal to a vertical height (e.g., vertical height 116) of a rack, and may be disposed on a front-face, a back-face, a perforated door, or any other location on a rack suitable to be seen from the distance 314. In the example of FIG. 5C, the thermochromic material 506 may also comprise a height substantially the same as the vertical height 508. In the example of FIG. 5D, the thermochromic material 506 may be configured to be disposed on the substrate material 504. FIG. 5D illustrates the substrate material 504 may comprise a curvilinear surface 510, which is arranged substantially along all or part of vertical height 508. While FIG. 5D illustrates the substrate material 504 being formed of a half round bar of a material, any other form of material may be used. For example, the substrate material 504 may be formed of a rectangular bar of material, triangular bar of material, a tube of material, a shaped sheet of material, or the like, suitable for having a thermochromic material 506 disposed thereon.

FIG. 5D illustrates the substrate material 504 may comprise a horizontal width 512 having a length of at least about 0.007 times the vertical height 508. For example, the horizontal width 512 may be about 0.3 inches, 0.5 inches, 0.8 inches, or the like, suitable for being seen from a distance while simultaneously not too wide as to block an airflow of a chassis. FIG. 5D further illustrates the substrate material 504 may comprise a material thickness 514 In some examples, the material thickness 514 may be at least about 0.3 inches and at most about 0.8 inches. The substrate material 504 may be a plastic (e.g., polypropylene (PP), acrylonitrile butadiene styrene (ABS), or the like), a metal, a composite, or the like, suitable for being removeably attached to a rack while having a thermochromic material 506 disposed thereon. The thermochromic material may be formed of cholesteryl nonanoate. The thermochromic material may be customized thermochromic microcapsules made available from Gem'innov located in Marseille, France. Further, with the thermochromic material 506 disposed on the curvilinear surface 510 of the substrate material 504, the thermochromic indicator 502 is configured to be visible within the angle of view 316 of up to 180 degrees.

The thermochromic material 506 may comprise a thermochromic ink, a thermochromic paint, a thermochromic paper, a thermochromic film, a thermochromic label, or the like, suitable for being disposed on a substrate material and indicating a real-time visual of airflows and air temperatures of computing equipment and devices house within a computing facility. For example, the thermochromic indicator 502 may have a thermochromic label disposed on the substrate material 504, such that the thermochromic indicator 502 provides a visual of airflow and air temperatures, via one, two, three, or four color changes, within one, ten, twenty, thirty, sixty, seconds or the like, depending on an application of the computing equipment and devices housed within a computing facility. Specifically, the substrate material 504 may be designed to provide a low heat conduction path (i.e., a small thermal mass) between the thermochromic material 506 (e.g., a thermochromic label) and a base of a chassis (e.g., a perforated door 118), which provides for a quick change in color when an air temperature varies with respect to the chassis. For example, the substrate material 504 may be formed of a plastic, which may have a wall thickness of less than 0.1 inches. The approximately 0.1 inch thick wall of plastic would provide a temperature response within about a 10 second range. By providing a quick change in color (i.e., one, two, three, or four color changes) when the air temperature varies with respect to the chassis, this provides a real-time visual of airflow and air temperatures of computing equipment and devices housed within a computing facility. Alternatively, if a slow change in color is desired, the substrate material 504 may be optimally designed to provide a high heat conduction path (i.e., a large thermal mass) between the thermochromic material 506 and a base of a chassis. Further, the thermochromic material 506 may be optimally designed to provide a quick or slow change in color in response to changes in air temperatures.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A thermal indicating system comprising:
an array of a plurality of racks configured to house telecommunication equipment, each of the plurality of racks having a front-face defining a cold air inlet side of the array; and
a thermochromic indicator disposed vertically along a height of the front-face of each of the plurality of racks and at least partially obstructing an airflow opening in the front face, wherein each of the thermochromic indicators indicates:
an air temperature gradation of cold air entering vertically along the height of the front-face of the respective rack on which the thermochromic indicator is disposed.

2. The system of claim 1, wherein each of the plurality of racks has a back-face opposite the front-face, the back-face defining a hot air exit side of the array, and the system further comprising:
another thermochromic indicator disposed vertically along the back-face of each of the plurality of racks, wherein each of the other thermochromic indicators indicates:
an air temperature of hot air exiting vertically along the back-face of the respective rack on which the thermochromic indicator is disposed.

3. The system of claim 2, wherein the front-face thermochromic indicators and the back-face thermochromic indicators of each rack comprise a thermochromic ink applied to the respective front-face and back-face subsequent to a painting of the front-face and the back-face of each rack.

4. The system of claim 2, wherein the front-face thermochromic indicators and the back-face thermochromic indicators of each rack comprise:
a thermochromic paint applied to a base metal of the respective front-face and the back-face of each rack;
a thermochromic plastic fastened to the respective front-face and the back-face of each rack; or
a thermochromic label applied to the respective front-face and the back-face of each rack.

5. The system of claim 1, wherein the array of the plurality of racks comprises a substantially linear array of a plurality of racks or a substantially curvilinear array of a plurality of racks.

6. The thermochromic indicator of claim 1, wherein the airflow opening is located on a perforated door.

7. A telecommunication equipment rack comprising:
computing equipment housed in an interior of the rack;
a front-face having a vertical height; and
a thermochromic indicator disposed on and extending substantially the vertical height of the front-face and at least partially obstructing an airflow path of the front-face, wherein the front-face thermochromic indicator indicates:
an air temperature gradation of air entering the airflow path along the vertical height of the front-face of the rack on which the thermochromic indicator is disposed.

8. The rack of claim 7, further comprising a back-face, opposite the front-face, having a vertical height; and
another thermochromic indicator disposed along the vertical height of the back-face, wherein the back-face thermochromic indicator indicates:
an air temperature of air exiting along the vertical height of the back-face of the rack on which the thermochromic indicator is disposed.

9. The rack of claim 8, wherein the front-face thermochromic indicator and the back-face thermochromic indicator each comprise a strip of thermochromic ink applied along the vertical height of the front-face and the back-face of the rack, respectively.

10. The rack of claim 9, wherein the front-face and the back-face each comprise a perforated door, and the strip of thermochromic ink is applied substantially proximate to a middle portion of each the perforated doors.

11. The rack of claim 8, wherein the front-face thermochromic indicator and the back-face thermochromic indicator each comprise an array of individual marks of thermochromic ink applied along the vertical height of the front-face and the back-face, respectively.

12. The rack of claim 11, wherein the front-face and the back-face each comprise a perforated door, and the array of individual marks of thermochromic ink are applied substantially proximate to a middle portion of each the perforated doors.

13. The rack of claim 8, wherein the front-face thermochromic indicator and the back-face thermochromic indicator each comprise a thermochromic paint applied to the front-face and the back-face.

14. The rack of claim 13, wherein the front-face and the back-face each comprise a rack post, and the thermochromic paint is applied to a base metal of each of the rack posts.

15. The rack of claim 13, wherein the front-face and the back-face each comprise a perforated door, and the thermochromic paint is applied to a base metal of each the perforated doors.

16. The rack of claim 8, wherein the front-face thermochromic indicator and back-face thermochromic indicator each comprise a thermochromic label applied to the front-face and the back-face.

17. The rack of claim 16, wherein the front-face and the back-face each comprise a perforated door, and each of the thermochromic labels are applied proximate to a middle portion of each the perforated doors.

18. The rack of claim 8, wherein the front-face thermochromic indicator and back-face thermochromic indicator each comprise a thermochromic plastic fastened to the front-face and the back-face.

19. A thermochromic indicator configured to be vertically disposed on a data center rack, the thermochromic indicator comprising:
   a substrate material configured to be removably disposed on an airflow opening of the rack, the substrate material comprising:
      a vertical height the same as a vertical height of the rack; and
      a curvilinear surface arranged along the vertical height; and
   a thermochromic material disposed on the curvilinear surface arranged along the vertical height to indicate multiple temperatures of air flowing into the rack along the vertical height at a same time.

20. The thermochromic indicator of claim 19, wherein the substrate material further comprises a material thickness having a minimum depth of at least about 0.3 inches and a maximum depth of at least about 0.8 inches.

21. The thermochromic indicator of claim 19, wherein the thermochromic material comprises a thermochromic ink, a thermochromic paint, a thermochromic paper, a thermochromic film, and/or a thermochromic label.

22. The thermochromic indicator of claim 19, wherein the thermochromic material is configured to be responsive to changes in air temperature.

23. The thermochromic indicator of claim 22, wherein the thermochromic material has a thickness to provide a color change responsive within 10 seconds.

* * * * *